(12) United States Patent
Son et al.

(10) Patent No.: US 12,599,001 B2
(45) Date of Patent: *Apr. 7, 2026

(54) DISPLAY DEVICE INCLUDING DISPLAY PANEL AND INFORMATION CODE

(71) Applicant: Samsung Display Co., Ltd., Yongin-Si (KR)

(72) Inventors: Sun Kwun Son, Suwon-si (KR); Na Hyeon Cha, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/422,996

(22) Filed: Jan. 25, 2024

(65) Prior Publication Data

US 2024/0194612 A1     Jun. 13, 2024

Related U.S. Application Data

(63) Continuation of application No. 15/931,512, filed on May 13, 2020, now Pat. No. 11,923,316.

(30) Foreign Application Priority Data

Aug. 29, 2019    (KR) ........................ 10-2019-0106692

(51) Int. Cl.
| | | |
|---|---|---|
| *G02F 1/1333* | (2006.01) | |
| *G02F 1/1339* | (2006.01) | |
| *G02F 1/1345* | (2006.01) | |
| *G02F 1/1362* | (2006.01) | |
| *H01L 23/544* | (2006.01) | |
| *H10K 59/131* | (2023.01) | |

(52) U.S. Cl.
CPC ...... *H01L 23/544* (2013.01); *G02F 1/133374* (2021.01); *G02F 1/1339* (2013.01); *G02F 1/13452* (2013.01); *G02F 1/13458* (2013.01); *G02F 1/136286* (2013.01); *H10K 59/131* (2023.02); *G02F 1/133388* (2021.01); *H01L 2223/54406* (2013.01); *H01L 2223/54413* (2013.01); *H01L 2223/54433* (2013.01); *H01L 2223/54486* (2013.01)

(58) Field of Classification Search
CPC ......... G02F 1/133374; G02F 1/133388; G02F 1/136286; H01L 23/544
See application file for complete search history.

(56) References Cited

U.S. PATENT DOCUMENTS

| | | | |
|---|---|---|---|
| 10,725,348 B2 | 7/2020 | Song et al. | |
| 11,016,348 B2 | 5/2021 | Song et al. | |
| 11,686,981 B2 | 6/2023 | Song et al. | |
| 2002/0190131 A1 | 12/2002 | Droz | |

(Continued)

FOREIGN PATENT DOCUMENTS

| | | |
|---|---|---|
| JP | 5464086 B2 | 4/2014 |
| KR | 10-2015-0106486 A | 9/2015 |

(Continued)

*Primary Examiner* — Paisley L Wilson
(74) *Attorney, Agent, or Firm* — Innovation Counsel LLP

(57) ABSTRACT

A display device according to an embodiment includes: a display panel; a first pad portion disposed on a lateral side of the display panel; and an information code disposed on the lateral side of the display panel.

19 Claims, 9 Drawing Sheets

(56)        References Cited

U.S. PATENT DOCUMENTS

2007/0025705 A1*   2/2007   Yoon ................. G02F 1/133351
                                                386/201
2014/0168581 A1    6/2014   Watanabe et al.
2016/0371558 A1    12/2016  Lee et al.
2017/0358602 A1    12/2017  Bae et al.
2019/0131248 A1    5/2019   Kong et al.
2022/0357622 A1    11/2022  Song et al.

FOREIGN PATENT DOCUMENTS

KR      10-2016-0148751  A      12/2016
KR      10-2019-0035993  A       4/2019
KR      10-2019-0048402  A       5/2019
PL               203214  B1 *    9/2009

* cited by examiner

DISPLAY DEVICE INCLUDING DISPLAY PANEL AND INFORMATION CODE

CROSS-REFERENCE TO RELATED APPLICATION

This application is a continuation application of U.S. patent application Ser. No. 15/931,512 filed on May 13, 2020, now U.S. Pat. No. 11,923,316, which claims priority to and the benefit of Korean Patent Application No. 10-2019-0106692 filed in the Korean Intellectual Property Office on Aug. 29, 2019, the disclosures of which are incorporated by reference herein in their entireties.

BACKGROUND

(a) Technical Field

This technical field relates to a display device.

(b) Description of the Related Art

Modern display devices such as a liquid crystal display or an emissive display device includes a display panel with a screen for displaying images. The display panel may be manufactured by forming layers and elements on a substrate.

The largest area of the display panel may be a display area forming a screen. Another region of the display panel—such as an edge region—may be a non-display area in which a driving circuit and signal lines are disposed. Conventionally, there are physical limitations of in reducing the non-display area (i.e., a bezel size) of the display device and increasing a screen-to-body ratio.

The display device may include a flexible printed circuit film bonded to the display panel that transmits signals for driving the display panel to the display panel. The display panel may have a pad portion to which the flexible printed circuit film is bonded which increases the non-display area. A side bonding method for forming a pad portion on a lateral side of the display panel and bonding a flexible printed circuit film to the lateral side of the display panel prevents the increase of the non-display area caused by the pad portion.

Regarding a production process and a distribution process of the display device, there is a need to manage information on the production process and the circulation process of the display device. That is, production and distribution is more efficient when information on an ID, a manufacturing date, resolution, or a defect history for each display device is identifiable. The information may be provided to the display panel in a readable way.

The above information disclosed in this Background section is only for enhancement of understanding of the background and therefore it may contain information that does not form the prior art that is already known in this country to a person of ordinary skill in the art.

SUMMARY

Embodiments provide a display device having a bezel with a reduced size and an easily readable information code.

An embodiment provides a display device including: a display panel; a first pad portion disposed on a lateral side of the display panel; and an information code disposed on the lateral side of the display panel.

The first pad portion may include a plurality of pads, and the information code may include a same material as the plurality of pads.

The information code may be disposed on a same layer as the plurality of pads.

The display device may further include a second pad portion disposed on the lateral side of the display panel, wherein the information code is disposed between the first pad portion and the second pad portion.

The information code may include at least one of a character code and a figure code.

The figure code may include a VeriCode.

The display panel may include a first substrate, a second substrate, and a sealing member for bonding the first substrate and the second substrate, and the information code may directly contact at least one of a lateral side of the first substrate and a lateral side of the second substrate.

The display panel may further include an edge member disposed between the first substrate and the second substrate, and the information code may directly contact at least one of the lateral side of the first substrate, the lateral side of the second substrate, and the lateral side of the edge member.

The display panel may further include a spacer disposed between the first substrate and the second substrate, and the edge member may include a same material as the spacer.

The information code may be disposed at one side of the first pad portion.

The display device may further include a flexible printed circuit film bonded to the first pad portion.

The display device may further include an integrated circuit chip provided on the flexible printed circuit film.

An embodiment of provides a display device including: a display panel including a first substrate and a second substrate bonded to each other, and a plurality of signal lines disposed between the first substrate and the second substrate; a first pad portion disposed on a first lateral side of the display panel and including a plurality of pads connected to the signal lines; and an information code disposed on the first lateral side and protruding from the first lateral side with a thickness.

The information code may contact at least one lateral side of the first substrate and the second substrate.

The information code may be disposed on a same layer as the plurality of pads and may include a same material as the plurality of pads.

The display device may further include a second pad portion disposed on a second lateral side of the display panel; and an information code disposed on the second lateral side. The information code may include a figure code.

The information code may not overlap the first pad portion.

The display panel may further include a liquid crystal layer disposed between the first substrate and the second substrate.

The display panel may further include a light emitting diode disposed between the first substrate and the second substrate.

According to the embodiments, the display device having a bezel with a reduced size and an easily readable information code may be provided. Further, although not specifically mentioned, according to the embodiments, effects recognizable in the entire specification may be obtained.

DETAILED DESCRIPTION OF THE EMBODIMENTS

Figure 1:
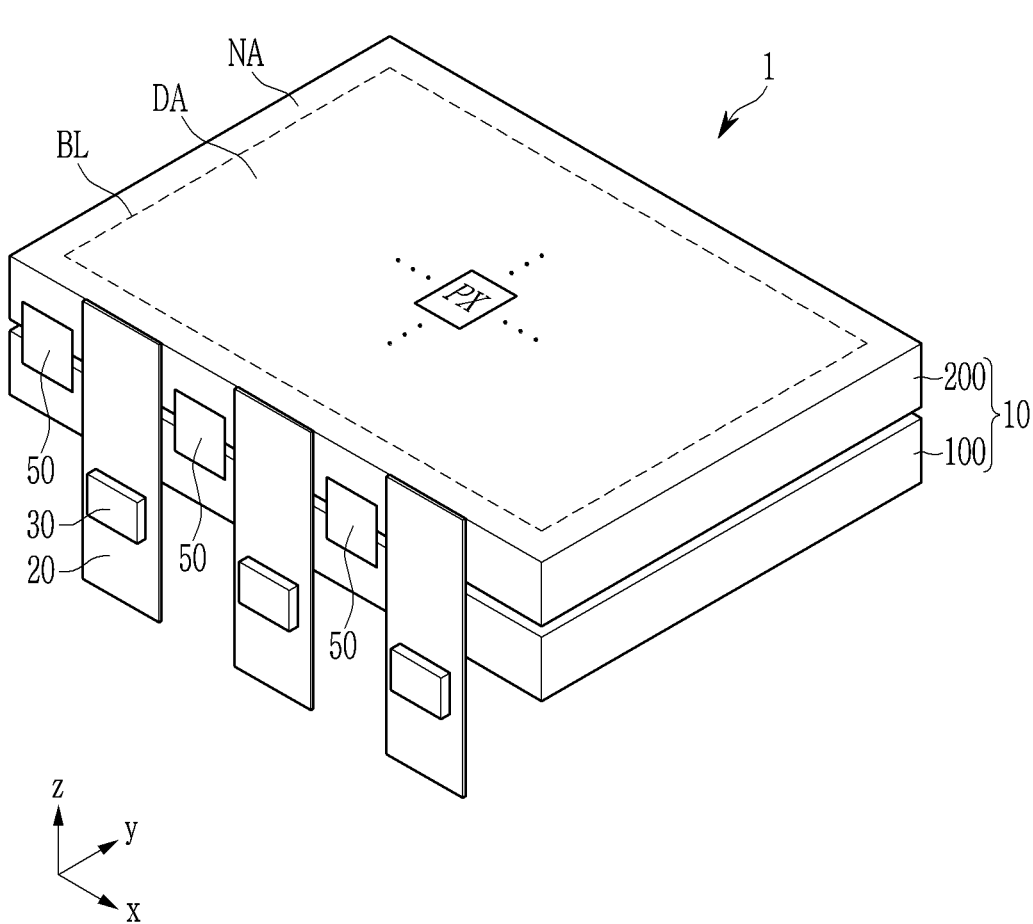
FIG. 1 shows a perspective view of a display device according to an embodiment.

In the following detailed description, certain embodiments of the inventive concept have been shown and described, as examples of the inventive concept. The described embodiments may be modified in various different ways, and are not restrictive.

In the drawings, dimensions of elements may be exaggerated for clarity.

Although the terms "first," "second," etc. may be used to describe various elements, these elements should not be limited by these terms. These terms may be used to distinguish one element from another element. A first element may be termed a second element without departing from teachings of one or more embodiments. The description of an element as a "first" element may not require or imply the presence of a second element or other elements. The terms "first," "second," etc. may be used to differentiate different categories or sets of elements. For conciseness, the terms "first," "second," etc. may represent "first-type (or first-set), " "second-type (or second-set)," etc., respectively.

When a first element is referred to as being "on" a second element, the first element can be directly on the second element, or one or more intervening elements may be present between the first element and the second element. When a first element is referred to as being "directly on" a second element, there are no intervening elements (except environmental elements such as air) present between the first element and the second element. The word "on" or "above" may mean "overlapping" or "below" and may not necessarily mean being positioned on the upper side of an object based on a gravitational direction.

Like reference numerals designate like elements throughout the specification.

In the present specification, unless explicitly described to the contrary, the word "comprise" and variations such as "comprises" or "comprising" may imply the inclusion of stated elements, but not the exclusion of any other elements.

The phrase "in a plan view" means viewing the object portion from the top, and the phrase "in a cross-sectional view" means viewing a cross-section of which the object portion is vertically cut from the side.

In the drawings, a symbol x used to express a direction represents a first direction, a symbol y indicates a second direction that is perpendicular to the first direction, and a symbol z denotes a third direction that is perpendicular to the first direction and the second direction.

Figure 2:
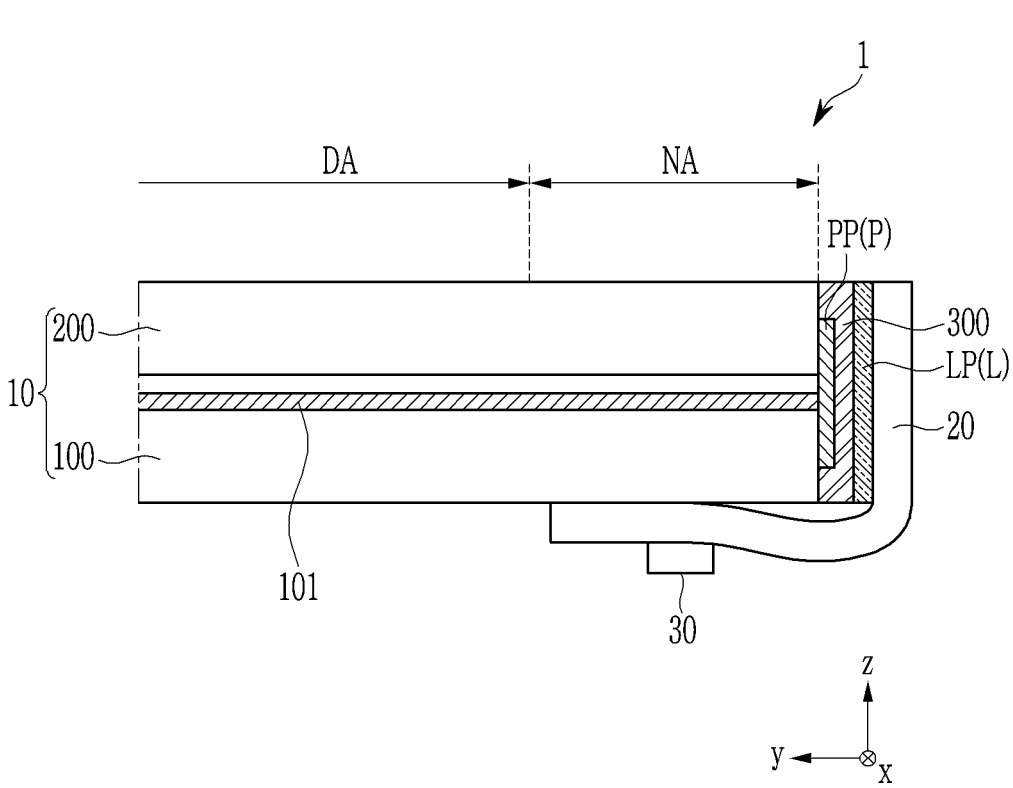
FIG. 2 shows a cross-sectional view of a display device shown in FIG. 1.
Figure 3:
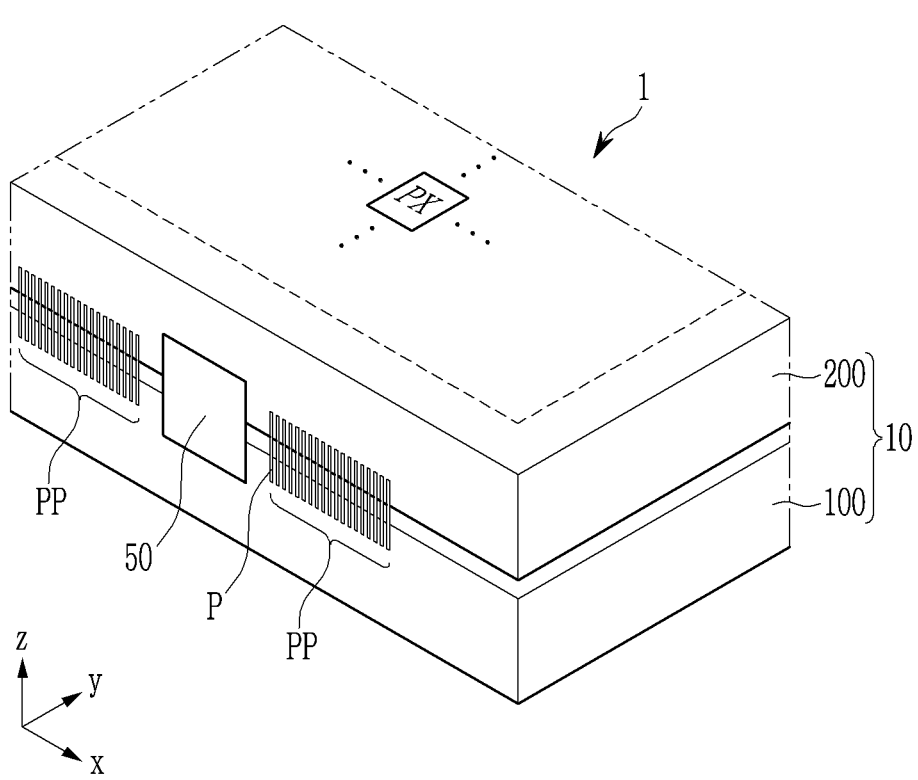
FIG. 3 shows a partial perspective view before a flexible printed circuit film is bonded in a display device shown in FIG. 1.
Figure 4:
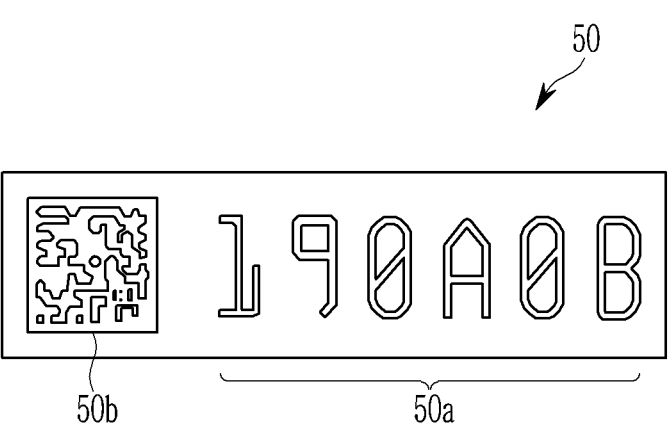
FIG. 4 shows an enlarged view of an information code shown in FIG. 1.

FIG. 1 shows a perspective view of a display device 1 according to an embodiment, FIG. 2 shows a cross-sectional view of a display device 1 shown in FIG. 1, FIG. 3 shows a partial perspective view before a flexible printed circuit film 20 is bonded to a display device 1 shown in FIG. 1, and FIG. 4 shows an enlarged view of an information code 50 shown in FIG. 1.

Referring to FIG. 1 and FIG. 2, the display device 1 includes a display panel 10. The display panel 10 includes a display area DA for displaying images, and a non-display area NA which is provided near the display area DA and in which wires for transmitting various signals applied to the display area DA are disposed. The display area DA may be an inside of a border line BL shown with dotted lines, and the non-display area NA may be an outside of the border line BL. The non-display area NA may be adjacent to and surrounding the display area DA.

Pixels PX are disposed in a matrix form in the display area DA of the display panel 10. Signal lines such as data lines or gate lines are also disposed in the display area DA. The gate lines may substantially extend in the first direction x (e.g., a row direction), and the data lines may substantially extend in the second direction y (e.g., a column direction) traversing the first direction x. Each of the pixels PX may be connected to a gate line and a data line, and may receive a gate signal and a data voltage (also referred to as a data signal) from the signal lines. In the case of the emissive display device, driving voltage lines for transmitting driving voltages to the pixels PX may be disposed in the display area DA, and emission control lines for transmitting emission control signals and/or initialization voltage lines for transmitting initialization voltages may be further disposed.

The display panel 10 may include touch electrodes (also collectively referred to as a touch sensor layer) for sensing contact or non-contact touches of a user, and the majority of touch electrodes may be provided in the display area DA.

Referring to FIG. 1, FIG. 2, and FIG. 3, the display panel 10 may include a first substrate 100 and a second substrate 200. When the display device 1 is a liquid crystal display, a liquid crystal layer may be provided between the first substrate 100 and the second substrate 200.

A pad portion PP includes pads P. Pads P receive signals from outside the display panel 10 may be provided on a lateral side of the display panel 10. The pads P may be connected to signal lines 101 that may be provided between the first substrate 100 and the second substrate 200 in the non-display area NA. Therefore, the signal inputs to the pads P may be transmitted to the signal lines 101 disposed to the display panel 10. The signal lines 101 may be connected to the signal lines of the display area DA, or they may be extensions of the signal lines of the display area DA.

The pads P may be provided on at least one of the lateral side of the first substrate 100 and the lateral side of the second substrate 200. In FIGS. 2 and 3, the pads P are provided on the lateral side of the first substrate 100 and the lateral side of the second substrate 200. The lateral side of the display panel 10 including the pads P includes both the lateral side of the first substrate 100 and the lateral side of the second substrate 200.

At least one information code 50 is provided on the lateral side of the display panel 10. The information code 50 may include various information about the display panel 10, for example: an ID, a manufacturing date, a display resolution, a size, or a defect history. Referring to FIG. 4, the information code 50 may include a character code 50*a* and a figure code 50*b*. The character code 50*a* is a character and/or a number that is human readable, so that the user managing production of the display device 1 may visually and semantically recognize the displayed character and/or number. The figure code 50*b* may be a two-dimensional code such as a VeriCode (a bar code), and it may have much more information than the character code 50*a*. The figure code 50*b* may not be human readable, and may be computer- or machine-readable. One information code 50 may include both the character code 50*a* and the figure code 50*b*, or it may include the character code 50*a* or the figure code 50*b*.

The information code 50 may be provided on the lateral side of the display panel 10 where the pad portion PP is provided. The information code 50 may be formed of a same material as the pad portion PP. The information code 50 may be formed by carving a metal layer for forming the pad portion PP with laser beams. The information code 50 may be formed by leaving a portion that corresponds to the information code 50 on the metal layer and removing another portion, or it may be formed by removing the portion that corresponds to the information code 50 from the metal layer. Therefore, because there is no need to form an additional layer so as to form the information code 50, the processing stages and cost are reduced. The information code 50 may be provided between neighboring pad portions PP, or the information code 50 may be provided on one side of the pad portion PP. The information code 50 does not overlap the pad portion PP.

The information code 50 may be read by a reader including a camera, where the reader is an electronic device. When the information code 50 is formed in the non-display area NA, the information code 50, particularly the figure code, may be misread because of a light blocking member or a wire provided in the non-display area NA and overlapping the information code 50. However, the information code 50 provided on the lateral side of the display panel 10 may be read without interference from other elements of the display panel, and thus may be accurately read without errors.

The display device 1 may include a flexible printed circuit film 20 bonded to the pad portion PP of the display panel 10. The flexible printed circuit film 20 may be bonded to the pad portion PP by a connecting member 300 such as an anisotropic conductive layer. The flexible printed circuit film 20 may include a lead portion LP on which leads L are arranged, and the leads L of the lead portion LP may be electrically connected to the pads P of the pad portion PP by the connecting member 300. A second end of the flexible printed circuit film 20 may be connected to the printed circuit board, and may receive signals such as image data, driving signals, or driving voltages. When the pad portion PP is provided on the lateral side of the display panel 10, and the flexible printed circuit film 20 is bonded to the lateral side of the display panel 10, the non-display area NA for bonding the flexible printed circuit film 20 is not needed, thereby reducing the bezel of the display device 1.

A driving device for generating and/or processing various signals for driving the display panel 10 may be provided on the flexible printed circuit film 20, or provided in the non-display area NA. The driving device may include a data driver for applying data voltages to data lines, a gate driver for applying gate signals to gate lines, and a signal controller for controlling the data driver and the gate driver.

The data driver may be provided as an integrated circuit chip 30. The integrated circuit chip 30 may be provided on the flexible printed circuit film 20. As shown in FIG. 2, the flexible printed circuit film 20 may be bent, and the integrated circuit chip 30 may be provided on the rear side of the display panel 10. The gate driver may be integrated as a driving circuit in the non-display area NA of the display panel 10. The gate driver may be provided in an integrated circuit chip form and provided on the flexible printed circuit film bonded to another lateral side of the display panel 10. The signal controller may be provided in an integrated circuit chip form and provided on a printed circuit board connected to the flexible printed circuit film 20.

The information code 50 will now be described with reference to FIG. 5, FIG. 6, and FIG. 7.

Figure 5:
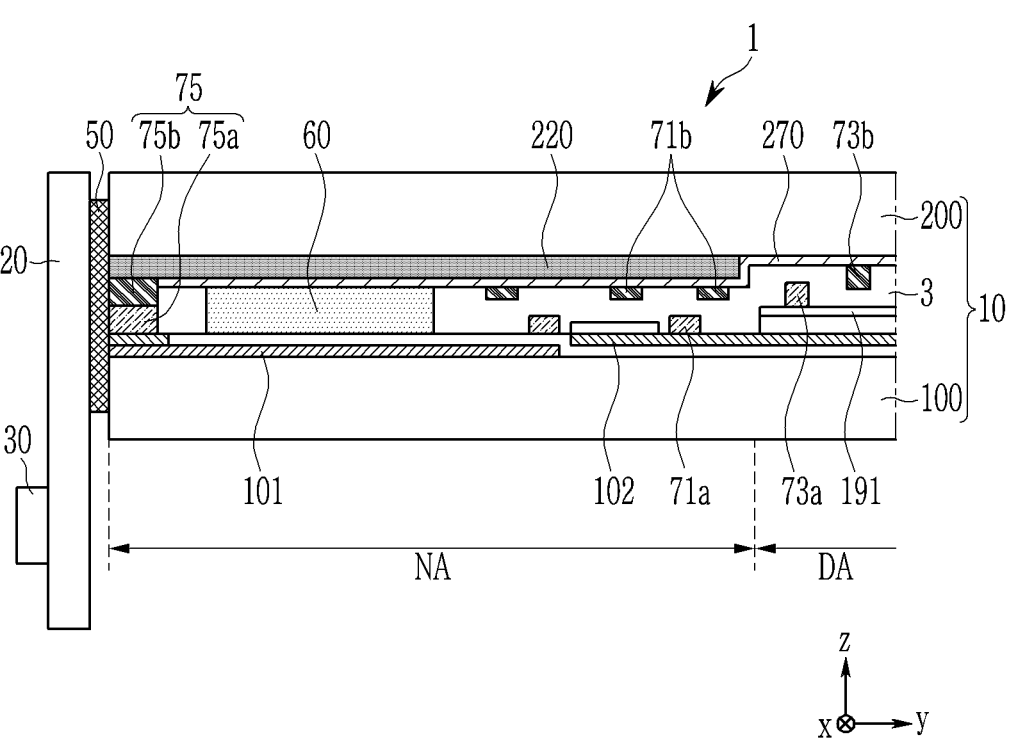
FIG. 5 shows a cross-sectional view of a display device shown in FIG. 1.
Figure 6:
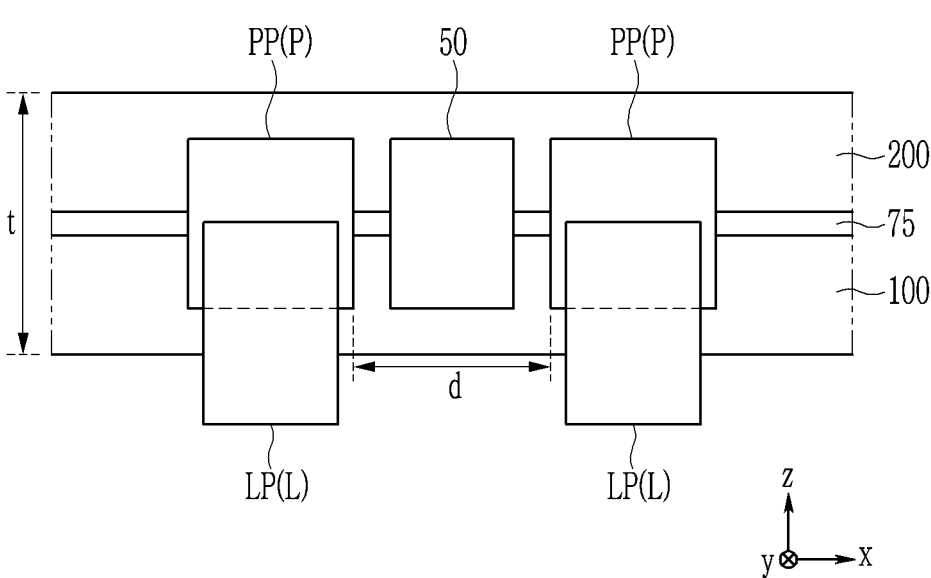
FIG. 6 shows a lateral side diagram of a display device shown in FIG. 1.
Figure 7:
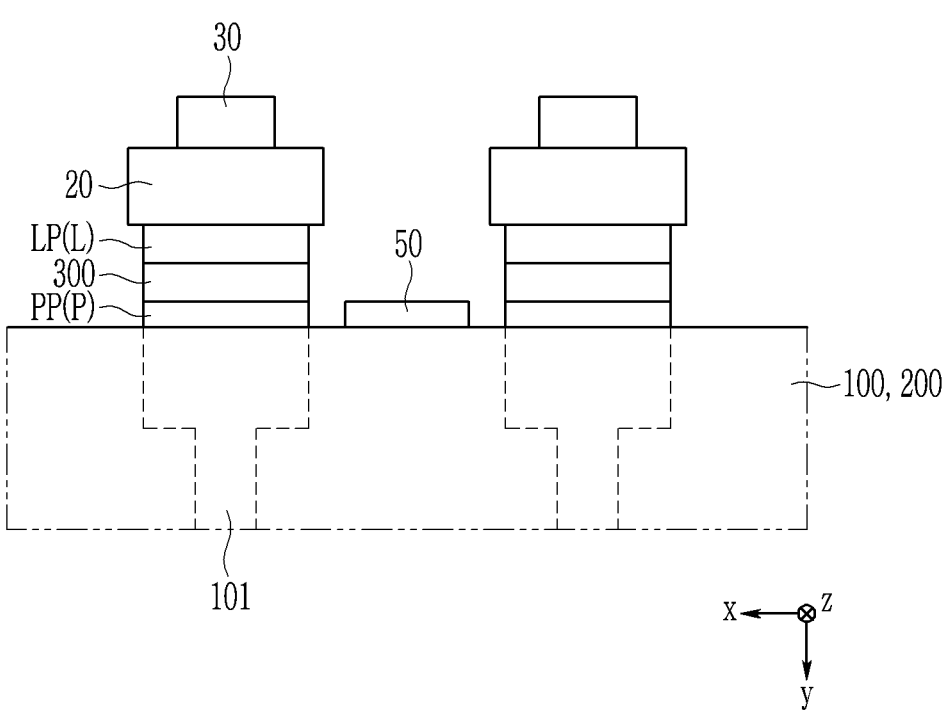
FIG. 7 shows a top plan view of a display device shown in FIG. 1.

FIG. 5 shows a cross-sectional view of a display device 1 shown in FIG. 1, FIG. 6 shows a lateral side diagram of a display device 1 shown in FIG. 1, and FIG. 7 shows a top plan view of a display device 1 shown in FIG. 1.

Referring to FIG. 5, the shown cross-section may correspond to a cross-section near an edge on which the information code 50 is provided in FIG. 1. The display device 1 may be a liquid crystal display, and the display panel 10 may include a liquid crystal layer 3 between the first substrate 100 and the second substrate 200. The first substrate 100 and the second substrate 200 may be transparent insulation substrates made of a material such as glass.

A circuit portion including transistors and signal lines 101 and 102 may be provided on the first substrate 100. The circuit portion may charge a data voltage to a liquid crystal capacitor of each pixel at a predetermined timing. In the display area DA, a pixel electrode 191 connected to the transistor may be provided on the circuit portion, and an alignment layer may be provided on the pixel electrode 191.

A light blocking member 220 may be provided on the second substrate 200 in the non-display area NA. The light blocking member 220 may prevent transmission of leaking light or light reflected from a metal layer in the non-display area NA. A common electrode 270 may be provided on the second substrate 200, and an alignment layer may be provided on the common electrode 270. The common electrode 270 may be provided on the first substrate 100.

The pixel electrode 191, the common electrode 270, and the liquid crystal layer 3 may form a liquid crystal capacitor. An electric field corresponding to a difference between the data voltage applied to the pixel electrode 191 and the common voltage applied to the common electrode 270 is applied to the liquid crystal layer 3. When the intensity of the electric field is varied by changing the data voltage, the liquid crystal molecules of the liquid crystal layer 3 may be rearranged, luminance of the respective pixels may be controlled by controlling light transmittance, and the image may be displayed by a combination of pixels.

The first substrate 100 and the second substrate 200 are provided in the non-display area NA, and they are bonded by a sealing member 60 surrounding the display area DA. A dam 71 may be provided on the first substrate 100 in the non-display area NA. The dam 71*a* prevents a solution (an aligning agent) for forming an alignment layer from flowing toward the sealing member 60. A dam 71*b* may likewise be provided on the second substrate 200 for the same purpose. Spacers 73*a* and 73*b* for maintaining a gap between the first substrate 100 and the second substrate 200 may be provided on the first substrate 100 and/or the second substrate 200. The spacers 73*a* and 73*b* may include an organic insulating material. The dams 71*a* and 71*b* and the spacers 73*a* and 73*b* may all be formed in the same process with the same material.

An edge member 75 may be provided outside of the sealing member 60 on the display panel 10. The edge member 75 may fill a gap that may exist between the first substrate 100 and the second substrate 200 on the lateral side of the display panel 10. Accordingly, the edge member 75 may increase attachment of the pads P to prevent the pads P from peeling off in the process for forming a metal layer on the lateral side of the display panel 10 and forming pads P. The pads P may contact the lateral side of the edge member 75. The edge member 75 may prevent the sealing member 60 from being spread to the outside of the display panel 10. The structure 75a provided on the first substrate 100 may be connected to a structure 75b provided on the second substrate 200. The structures 75a and 75b and the spacers 73a and 73b may be formed of the same material, for example, the same organic insulating material, in the same process. The lateral side of the edge member 75 may be provided on substantially the same lateral sides as the first substrate 100 and the second substrate 200.

The information code 50 provided on the lateral side of the display panel 10 may contact the lateral side of the first substrate 100, the lateral side of the second substrate 200, and/or the lateral side of the edge member 75. In FIG. 5, the information code 50 directly contacts the lateral sides of the first substrate 100, the second substrate 200, and the edge member 75. When the information code 50 is formed in the non-display area NA, the information code 50 may overlap the light blocking member 220, so there may be difficulty in reading the information code 50 because of the light blocking member 220. This difficulty results in errors in automating classification of the display panel 10. However, since the information code 50 is provided on the lateral side of the display panel 10, the light blocking member 220 does not hinder reading of the information code 50.

Referring to FIG. 6 and FIG. 7, the pads P that are separated from each other are shown to have a size that corresponds to one pad portion PP, and the leads L that are separated from each other are shown to have a size that corresponds to one lead portion LP.

The gap d between the adjacent pad portions PP may be equal to or greater than about 5 mm. A thickness t of the display panel 10 may be equal to or less than about 1.5 mm; for example, the thickness t may be about 1 mm. Therefore, when the information code 50 is formed on the lateral side of the display panel 10, a space that is sufficient for forming the information code 50 in an easily readable size between the adjacent pad portions PP may be obtained. When the height of the characters or the figures of the information code 50 are set to be equal to or less than about 0.4 mm or about 0.3 mm, the information code 50 may be formed so that it may be readable as a plurality of lines.

The information code 50 may be formed of the same material and on the same layer as the pads P. The pads P may be formed by coating a metal material such as silver (Ag), copper (Cu), aluminum (Al), or gold (Au) on the lateral side of the display panel 10 using a method such as printing, plating, or sputtering, and patterning a metal layer. For example, a paste including silver (Ag) may be coated on the lateral side of the display panel 10 by a printing method, hardened to form a conductive layer, which may then be patterned with laser beams to form pads P. In another method, the pads P may be formed on the lateral side of the display panel 10 by a method such as stamping or silk screening.

In the case of patterning for forming pads P or in the case of forming pads P, a metal layer for forming an information code 50 between the pad portions PP may remain or may be generated. The information code 50 may be formed by patterning the metal layer between the pad portions PP by use of laser equipment such as a titler. Since the information code 50 is formed by patterning the metal layer formed on the lateral side of the display panel 10, the information code 50 may protrude from the lateral side of the display panel 10 by a predetermined thickness. The thickness of the information code 50 may substantially corresponds to the thickness of the pads P. The information code 50 may be formed at the time of the patterning by which the pads P are formed.

Figure 8:
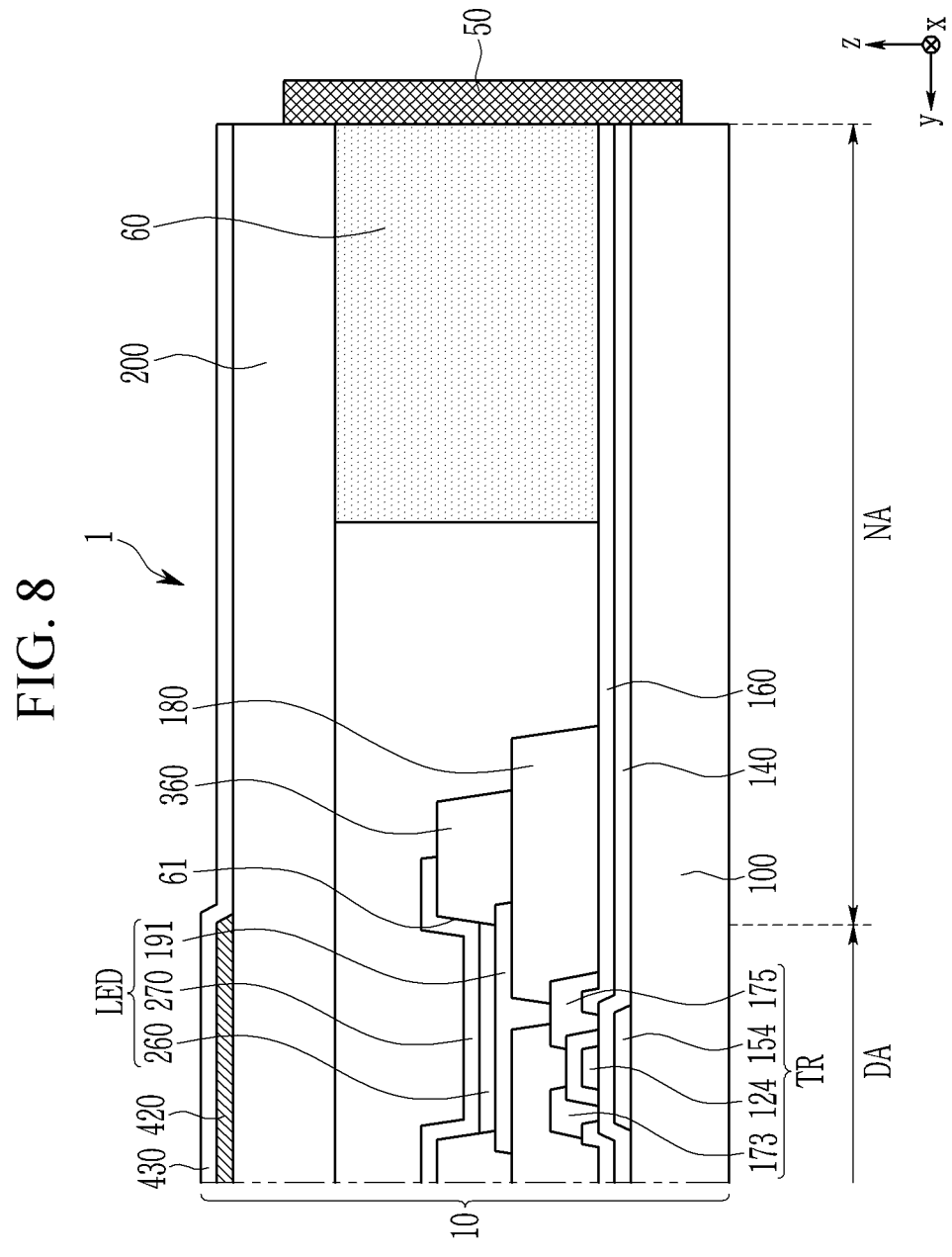
FIG. 8 shows a cross-sectional view of a display device according to an embodiment.

FIG. 8 shows a cross-sectional view of a display device according to an embodiment.

The display device 1 includes a display panel 10 including a display area DA and a non-display area NA.

The display panel 10 may include a first substrate 100. A semiconductor layer 154 of a transistor TR may be provided on the first substrate 100. The semiconductor layer 154 may include a channel region, and a source region and a drain region provided on respective sides of the channel region. The semiconductor layer 154 may include polysilicon, amorphous silicon, or an oxide semiconductor.

A buffer layer prevents spreading of impurities that degrade characteristics of the semiconductor layer 154 and also prevents moisture from permeating. The buffer layer may be provided between the first substrate 100 and the semiconductor layer 154.

A first insulating layer 140 may be provided on the semiconductor layer 154. The first insulating layer 140 may include an inorganic insulating material such as a silicon oxide ($SiO_x$) or a silicon nitride ($SiN_x$).

A gate conductor including a gate electrode 124 of the transistor TR and a gate line may be provided on the first insulating layer 140. The gate electrode 124 may overlap the channel region of the semiconductor layer 154. The gate conductor may include a metal such as molybdenum (Mo), copper (Cu), aluminum (Al), silver (Ag), chromium (Cr), tantalum (Ta), or titanium (Ti).

A second insulating layer 160 including an inorganic insulating material may be provided on the gate conductor. A data conductor including a source electrode 173 and a drain electrode 175 of the transistor TR, a data line, and a driving voltage line may be provided on the second insulating layer 160. The data conductor may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), or tantalum (Ta).

The source electrode 173 and the drain electrode 175 may be respectively connected to the source region and the drain region of the semiconductor layer 154 through openings of the second insulating layer 160. The gate electrode 124, the source electrode 173, and the drain electrode 175 form a transistor TR.

A third insulating layer 180 may be provided on the second insulating layer 160 and the data conductor. The third insulating layer 180 may include an organic insulating material.

A pixel electrode 191 may be provided on the third insulating layer 180. The pixel electrode 191 may be connected to the source electrode 173 or the drain electrode 175 of the transistor TR through an opening formed in the third insulating layer 180. The pixel electrode 191 may be formed of a reflective conductive material or a semi-transmitting conductive material, and it may be formed of a transparent conductive material. The pixel electrode 191 may include a transparent conductive material such as an indium tin oxide (ITO) or an indium zinc oxide (IZO), and a metal such as lithium (Li), calcium (Ca), aluminum (Al), silver (Ag), magnesium (Mg), or gold (Au).

A fourth insulating layer 360 may be provided on the third insulating layer 180 and the pixel electrode 191. The fourth insulating layer 360 may include an opening 61 overlapping the pixel electrode 191. The opening 61 of the fourth insulating layer 360 may delimit a region that corresponds to an emission region of the pixel. The fourth insulating layer 360 may include an organic insulating material such as polyimide or polyacrylate.

An emission member 260 including an emission layer may be provided on the pixel electrode 191. A common electrode 270 for transmitting a common voltage may be provided on the emission member 260. The common electrode 270 may include a transparent conductive material such as an indium tin oxide (ITO) or an indium zinc oxide (IZO). The common electrode 270 may be formed to have light transmissivity by stacking thin metals such as calcium (Ca), barium (Ba), magnesium (Mg), aluminum (Al), or silver (Ag). At least one protection layer or functional layer may be provided on the common electrode 270.

The pixel electrode 191 of each pixel, the emission member 260, and the common electrode 270 may form a light emitting diode LED. The light emitting diode LED may be an organic light emitting diode. The pixel electrode 191 may be an anode that is a hole injection electrode, and the common electrode 270 may be a cathode that is an electron injection electrode. Holes and electrons are injected into the emission member 260 from the pixel electrode 191 and the common electrode 270, and when excitons that are a combination of the injected holes and electrons transit to a ground state from an excited state, light is emitted.

The display panel 10 may include a second substrate 200 facing the first substrate 100. A touch sensor layer including a touch electrode 420 may be provided on the second substrate 200. The touch sensor layer may be used to sense a contact and/or non-contact (e.g., proximity) touch of a user. The touch electrode 420 may be provided in the display area DA. The touch electrode 420 may be formed of a transparent conductive material, a metal mesh, or a conductive polymer. A protection layer 430, which may be an insulating layer, may be provided on the touch electrode 420. The touch electrode 420 may be provided on an inside (i.e., a side provided toward the first substrate 100) of the second substrate 200, or it may be formed on an additional substrate and attached to the second substrate 200.

A sealing member 60 provided between the first substrate 100 and the second substrate 200 may bond the first substrate 100 and the second substrate 200, and may tightly seal the display panel 10.

The information code 50 may be provided on the lateral side of the display panel 10. The information code 50 and the pads of the pad portion provided on the lateral side of the display panel 10 may be formed on the same layer and of the same material.

Figure 9:
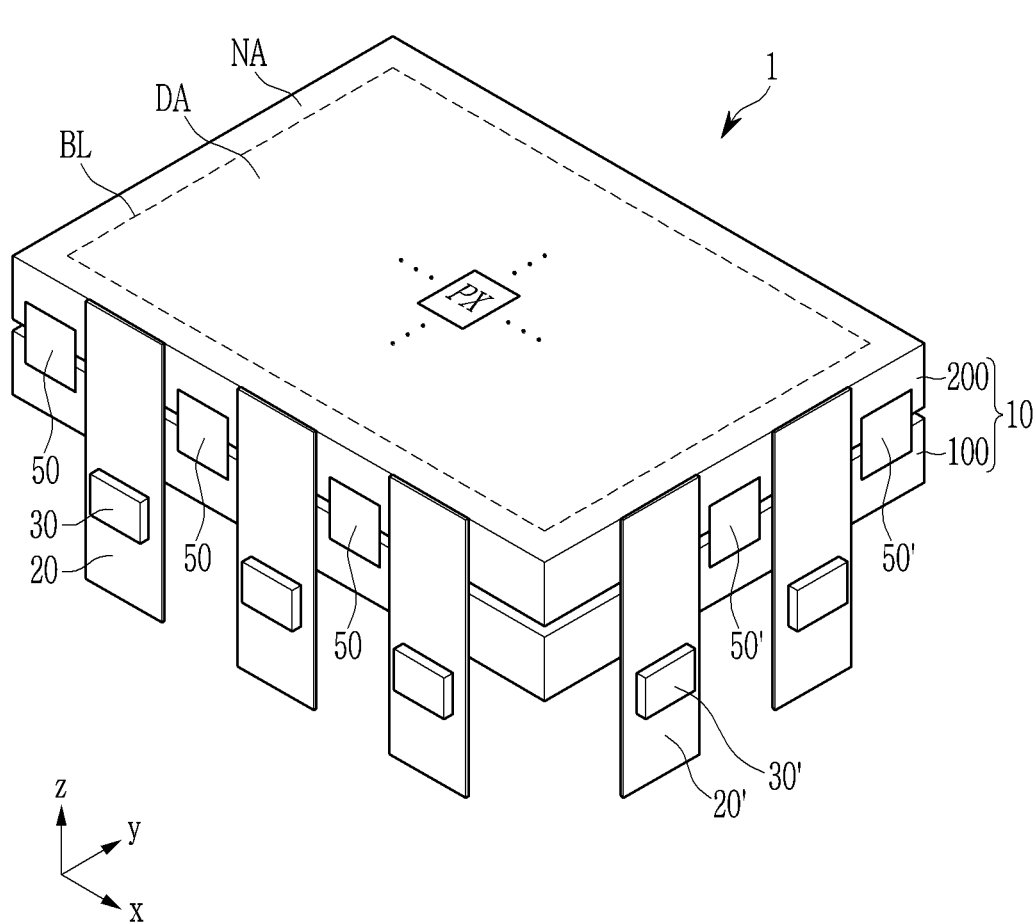
FIG. 9 shows a perspective view of a display device according to an embodiment.

FIG. 9 shows a perspective view of a display device according to an embodiment.

Referring to FIG. 9, the gate driver of the display device 1 is provided as a second integrated circuit chip 30'. The second integrated circuit chip 30' may be provided on a second flexible printed circuit film 20', and the second flexible printed circuit film 20' may be bonded to the pad portion provided on another lateral side of the display panel 10. That is, two lateral sides of the display panel may respectively include a flexible printed circuit film 20 and a second flexible printed circuit film 20'. The two lateral sides may share a corner. The flexible printed circuit film 20' on which the integrated circuit chip 30' is provided may also be bonded to a lateral side of the display panel 10 opposite to the another lateral side. When the gate driver is provided as described above, the width of the non-display area NA may be reduced compared to the case in which the gate driver is integrated in the non-display area NA of the display panel 10 as a driving circuit. The information code 50' may be disposed on the another lateral side. While the inventive concept has been described in connection with what is presently considered to be practical embodiments, it is to be understood that the inventive concept is not limited to the disclosed embodiments, but, on the contrary, is intended to cover various modifications and equivalent arrangements included within the spirit and scope of the inventive concept.

What is claimed is:

1. A display device comprising:
   a display panel configured to display images, the display panel including a first substrate and a second substrate overlapping the first substrate, wherein the second substrate includes a front side for displaying images and a lateral side facing a direction different from a direction that the front side faces, and the first substrate includes a lateral side facing a direction different from the direction that the front side faces; and
   an information code disposed across the lateral side of the first substrate and the lateral side of the second substrate,
   wherein the information code includes at least one of a character code or a figure code, each of which includes information about the display panel, and
   wherein the information code is an integral information code that extends from the lateral side of the first substrate to the lateral side of the second substrate.

2. The display device of claim 1, wherein the information code includes a first portion disposed on the lateral side of the first substrate, a second portion disposed on the lateral side of the second substrate, and a middle portion connecting the first portion and the second portion.

3. The display device of claim 1, further comprising:
   a first pad disposed on at least one of the lateral side of the first substrate and the lateral side of the second substrate.

4. The display device of claim 3, wherein the first pad includes a first portion disposed on the lateral side of the first substrate and a second portion disposed on the lateral side of the second substrate.

5. The display device of claim 4, further comprising a second pad disposed on at least one of the lateral side of the first substrate and the lateral side of the second substrate, wherein the information code is disposed between the first pad and the second pad.

6. The display device of claim 5, further comprising a flexible printed circuit film bonded to at least one of the first pad and the second pad.

7. The display device of claim 1, wherein the figure code includes a two-dimensional code.

8. The display device of claim 1, wherein the information code directly contacts the lateral side of the first substrate and the lateral side of the second substrate.

9. The display device of claim 1, wherein the display panel further includes an edge member disposed between the first substrate and the second substrate, and
   wherein the information code directly contacts the lateral side of the first substrate, the lateral side of the second substrate, and a lateral side of the edge member.

10. The display device of claim 9, wherein the display panel further includes a spacer disposed between the first substrate and the second substrate, and
    wherein the edge member includes a same material as the spacer.

11. A display device comprising:
    a display panel configured to display images, the display panel including a first substrate and a second substrate overlapping the first substrate, and signal lines disposed between the first substrate and the second substrate, wherein the second substrate includes a front side for displaying images and a lateral side facing a direction different from a direction that the front side faces, and the first substrate includes a lateral side facing a direction different from the direction that the front side faces;

a first pad disposed on at least one of the lateral side of the first substrate and the lateral side of the second substrate, and electrically connected to one of the signal lines; and an information code disposed across the lateral side of the first substrate and the lateral side of the second substrate and protruding from the lateral side of the first substrate and the lateral side of the second substrate, wherein the information code includes at least one of a character code or a figure code, each of which includes information about the display panel, and wherein the information code is an integral information code that extends from the lateral side of the first substrate to the lateral side of the second substrate.

12. The display device of claim 11, wherein the information code directly contacts the lateral side of the first substrate and the lateral side of the second substrate.

13. The display device of claim 11, wherein the information code includes a same material as the first pad.

14. The display device of claim 11, wherein the information code includes a first portion disposed on the lateral side of the first substrate, a second portion disposed on the lateral side of the second substrate, and a middle portion which connects the first portion to the second portion.

15. The display device of claim 11, further comprising:

a second pad disposed on at least one of the lateral side of the first substrate and the lateral side of the second substrate, and electrically connected to one of the signal lines, wherein the information code is disposed between the first pad and the second pad.

16. The display device of claim 11, wherein the information code includes a figure code.

17. The display device of claim 11, wherein the display panel further includes a liquid crystal layer disposed between the first substrate and the second substrate, or a light emitting diode disposed between the first substrate and the second substrate.

18. The display device of claim 11, wherein the first pad includes a first side and a second side opposite to the first side, and wherein the first side is in contact with the at least one of the lateral side of the first substrate and the lateral side of the second substrate, and the second side protrudes from the lateral side of the first substrate and the lateral side of the second substrate.

19. The display device of claim 11, wherein the first pad includes a first portion disposed on the lateral side of the first substrate and a second portion disposed on the lateral side of the second substrate.

* * * * *